United States Patent [19]
Gabillard et al.

[11] Patent Number: 5,173,624
[45] Date of Patent: Dec. 22, 1992

[54] LEVEL-SHIFTER CIRCUIT FOR HIGH-SPEED LOW-POWER BICMOS ECL TO CMOS INPUT BUFFERS

[75] Inventors: Bertrand Gabillard, Paris; Philippe Girard, Corbeil-Essonnes; Michel Granguillot, Verrières-le-Buisson, all of France

[73] Assignee: International Business Machines Corporation, Armonk, N.Y.

[21] Appl. No.: 788,956

[22] Filed: Nov. 7, 1991

[30] Foreign Application Priority Data

Feb. 28, 1991 [EP] European Pat. Off. ........ 91480034.7

[51] Int. Cl.[5] .................... H03K 19/092; H03K 19/02
[52] U.S. Cl. .................................... 307/475; 307/446; 307/451; 307/455
[58] Field of Search ................ 307/475, 446, 451, 455

[56] References Cited

U.S. PATENT DOCUMENTS

| | | | |
|---|---|---|---|
| 4,806,799 | 2/1989 | Pelley et al. ......................... | 307/475 |
| 4,992,681 | 2/1991 | Urakawa et al. .................... | 307/475 |
| 5,068,551 | 11/1991 | Bosnyak ............................ | 307/475 |
| 5,075,578 | 12/1991 | Wendell ............................ | 307/475 |
| 5,103,121 | 4/1992 | Wendell et al. ..................... | 307/475 |

FOREIGN PATENT DOCUMENTS 0410885 7/1990 European Pat. Off. .

OTHER PUBLICATIONS

IEEE JSSC, vol. 24, No. 4, Aug. 1989, "An 8-ns 256K BiCMOS RAM", by N. Tamba et al.

*Primary Examiner*—Edward P. Westin
*Assistant Examiner*—Richard Roseen
*Attorney, Agent, or Firm*—Michael Balconi-Lamica

[57] ABSTRACT

Input ECL level signals are received and converted into output CMOS level signals by input buffer (30). The input buffer (30) biased between first and second supply voltage (Vcc, Vee) and is comprised of three stages. The first stage (11A) consists of a conventional emitter-follower transistor (Q1) and a current-switch (13) connected in series. The input signal VIN at the ECL level is applied to the base of the emitter-follower transistor (Q1). The output signals (VA, VB) obtained therefrom drive a second stage which consists of an input buffer circuit (20), which supplies two pairs of output signals (V1) V2; V1', V2') for each phase. Each pair of output signals drives an output driver (31; 31') forming the third stage. The input buffer circuit (20) is composed of two NPN bipolar transistor (T1; T2) connected in an emitter-follower configuration forming two branches. In each branch, the emitter load consists of three FET devices: two PFETs (P1, P3; P2, P4) and one NFET (N1; N2) serially connected. The common node (E; F) between the PFETs in one branch, is cross-coupled to the gate electrode of the NFET (N2; N1) of the other branch. The gate electrode of the PFET (P1; P2) connected to the emitter of the bipolar transistor (T1; T2) in one branch is driven by the potential of the common node formed by the other PFET (P4, P3) and the NFET (N2; N1) in the other branch. The IN PHASE (VOUT) and OUT OF PHASE ($\overline{VOUT}$) circuit output signals are available at the circuit output terminals (32; 32') of said output drivers (31; 31') at the CMOS levels.

15 Claims, 4 Drawing Sheets

LEVEL-SHIFTER CIRCUIT FOR HIGH-SPEED LOW-POWER BICMOS ECL TO CMOS INPUT BUFFERS

TECHNICAL FIELD

The present invention relates to BiCMOS logic circuits, and more particularly, to a level-shifter circuit for use in BiCMOS ECL to CMOS input buffers.

BACKGROUND ART

Recently, new circuits have been developed to implement both CMOS and bipolar devices on the same semiconductor chip to benefit from their respective advantages, leading to what is known as BiCMOS technologies. For instance, more and more Static Random Access Memories (SRAMs) designs use these BiCMOS technologies to achieve better speeds than pure CMOS memories and lower power consumptions than pure bipolar memories. As a result, both bipolar devices (such as of the ECL type) and CMOS devices are simultaneously found in the same chip. A major concern with BiCMOS circuits, however, is that the high and low voltage levels in ECL circuits are different than those in CMOS circuits. For example, typical ECL circuits operate with standard high and low voltages of approximately −0.9 and −1.7 volts respectively, while typical CMOS circuits operate with high and low voltages of about −0.4 and 4.1 volts respectively. As a result, in order to couple the output of an ECL circuit to the input of a CMOS circuit, a converting circuit is commonly employed to change the logic levels. For example, most of the BiCMOS stand-alone SRAM chips require input buffers or receivers with ECL compatible input voltages and CMOS compatible output voltages. As a matter of fact, input buffers are essential to the overall performance of BiCMOS SRAMs chips. In addition, high density BiCMOS SRAMs (1Mb to 4Mb and over) require CMOS transistors with submicronic gate lengths that often cannot withstand ECL power supply levels. For example, in the ECL 100 K family, the standard supply voltages that are applied are Vee = −4.5 V and Vcc = 0 V. These supply voltages, however, produce a "hot electron effect" in CMOS circuits which thereby causes undesirable threshold voltage (VT) shifts. For all these reasons, it is required to supply dense BiCMOS SRAMs with power supplies that provide supply voltages lower than those used for the bipolar circuits.

A typical state of the art input buffer consists of three stages: an ECL receiver, an ECL-CMOS level-shifter, and an output driver. Unfortunately, with this conventional type of circuit, current flows constantly therein, thereby causing permanent power dissipation. Another problem is that ECL voltages tend to drift with changes in environmental conditions such as temperature. Because the swing between the high and low levels for an ECL circuit is only 0.8 volts, changes of a few tenths of a volt can create performance and noise margin problems that are detrimental to correct operation of the circuit.

Still another problem is that the level conversion produced by the level-shifter stage introduces a propagation delay which adversely affects the performance of the input buffer. The number of transistors used in the level-shifter stage has a direct impact on the performance and on chip space required to implement the input buffer in an integrated circuit.

A recent tentative solution of the prior art to these acute problems is given in: an article "An 8 ns 256 k BiCMOS RAM", by Tamba et al, published in the IEEE Journal of Solid State Circuits, Aug. 1989, pp. 1021–1026 (Ref. (1). According to this article, and more particularly in FIG. 8 thereof, there is disclosed a two-stage input buffer that converts input signals of the ECL standard into output signals of the CMOS type. For sake of illustration, this two-stage input buffer is represented in FIG. 1 of the present patent application where it bears reference 10.

Referring now to FIG. 1, the first stage 11 of input buffer 10 is formed by an input emitter-follower circuit 12, a current-switch circuit 13, and an active pull-down circuit 14. The input emitter-follower circuit 12 comprises NPN transistor Q1 and current source $I_0$. The current-switch circuit 13 is formed by NPN transistors Q2 and Q3 connected in a differential configuration and fed by current source I1 (Q4/R3). NPN transistors Q2 and Q3 are respectively loaded by resistors R1 and R2. The base of transistor Q2 is driven by the emitter of transistor Q1, while the base of transistor Q3 is connected to a reference voltage VR. The input emitter-follower circuit 12 and the current-switch circuit 13 form the ECL receiver mentioned hereinbefore. The ECL receiver referenced 11A is biased between the first and the second supply voltages Vcc (typically the ground) and Vee (e.g. −4.5 V for the 100 K ECL family). The role of ECL receiver 11A is to amplify the input signal Vin. The amplified signals VA and VB are respectively available at nodes A and B of the ECL receiver. The active pull-down circuit 14 is comprised of two emitter-follower circuits each consisting of a bipolar NPN transistor and a terminal impedance consisting of a NFET as the emitter load. These devices are referenced Q5, QN1 and Q6, QN2 respectively, for the first and second emitter-follower circuits. The base electrodes of transistors Q5 and Q6 are connected to nodes A and B of the current-switch circuit 13. The active pull-down circuit 14 is connected between said first supply voltage Vcc and a third supply voltage Vt (e.q. Vt = −2 V). First stage 11 supplies two output signals S1 and S2, which drive the second stage.

The second stage 15 includes the ECL-CMOS level-shifter circuit 16 and a booster circuit 17. The latter comprises two NPN bipolar transistors Q7 and Q8 to form the driver output stage of input buffer 10. In the upper part of the level-shifter circuit 16, one pair of PFETs QP1 and QP2 and one pair of NFETs QN3 and QN4 are coupled to drive the base of transistor Q7. PFETs QP1 and QP2 are driven by the signals S1 and S2 supplied by the active pull-down circuit 14. The common node of devices QP2 and QN4 is connected to the base of output transistor Q7. Similarly, the lower part of circuit 16 comprises three NFETs QN5, QN6 and QN7 and one PFET QP3 coupled as shown in FIG. 1. The gate electrode of PFET QP3 is driven by signal S1. The signal supplied by the common node of NFETs QN6 and QN7 drives the base of output transistor Q8. The drain of NFET QN7 and the gate electrode of NFET QN6 are connected to the common node 19 of output transistors Q7 and Q8, referred to as the circuit output node of input buffer 10. When the circuit input signal Vin at the ECL standard is applied to terminal 18 of input buffer 10, the latter produces the MOS/CMOS circuit output signal Vout at terminal 19 which is coupled to the circuit output node.

When the current-switch output signal VA at node A is low (signal VB is high), NFET QN2 cuts off the current of transistor Q6, while transistor Q5 and NFET QN1 are conductive. Thus, active pull-down circuit 14 dissipates only half the power of the conventional ECL-CMOS level-shifter circuit mentioned above.

The circuit buffer 10 of FIG. 1 is of the single phase type because it produces only one phase (Vout) of the circuit output signal. However, should the complement phase ($\overline{\text{Vout}}$) be required, the second stage 15 must be doubled by a replicate circuit referenced 15', as shown in FIG. 2.

Referring now to FIG. 2, the two-stage input buffer 10 of FIG. 1 is schematically shown in a two-phase version referenced 10' supplying simultaneously Vout and $\overline{\text{Vout}}$ circuit output signals, at terminals 19 and 19'. Input buffer 10 is used to illustrate the various circuits that are necessary for its implementation to establish the component count. The input buffer 10' of FIG. 2 comprises seven circuit blocks and if one excludes the ECL receiver properly said (circuits 12 and 13) and the third supply voltage generator (Vt gen.), the component count is 6 bipolar transistors and 18 FET devices.

In summary, DC current consumed by input buffer 10 is reduced due to the particular active pull-down circuit 14 disclosed therein. In addition, because level-shifter 16 and output driver 17 are combined into a single circuit (ECL-CMOS level-shifter with bipolar booster), input buffer 10 is only formed by two stages instead of three as in comparative circuits. Consequently, higher speeds and better density integration are achieved with respect to said input buffer 10. For example, there is claimed a propagation delay time less than 1,8 ns at 10-mW power dissipation. However, the input buffer 10 of FIG. 1 still has some major inconveniences, because it provides only a partial solution to the problems mentioned above as will be explained hereinafter.

First, active pull-down circuit 14 still dissipates excessive power, even though less than in prior art circuits because in the quiescent state, either transistor Q5 or Q6 is conductive. Thus, current is drawn from the supply voltage Vcc. In addition, pull-down circuit 14 necessitates a specific Vt reference voltage generator (apparent from FIG. 2) which needs several components for its implementation. Input buffer 10 is a relatively dense circuit, (since it has a two-stage structure, when compared with prior art three-stage input buffers) but, in the two-phase version of FIG. 2, the necessary replication of the second stage 15, significantly reduces the advantages claimed in the single phase version in terms of integration density.

Moreover, the input buffer 10 of FIG. 1 is relatively slow, because of the two-level structure of the lower part of level-shifter circuit 16, which slows down the control of output transistor Q8. Finally, because the active pull-down circuit 14 shifts the first stage output signals S1 and S2 by only one Vbe (base-emitter voltage drop of transistor Q5 or Q6, around 0,8V), only a low amplification effect is produced. As a result, more devices are required in the level-shifter circuit 16.

DISCLOSURE OF THE INVENTION

A primary object of the present invention is to provide a BiCMOS level-shifter circuit that dissipates substantially no power in the quiescent state.

Another object of the present invention is to provide a BiCMOS level-shifter circuit which does not require a specific voltage generator for the active pull-down circuit.

Another object of the present invention is to provide a BiCMOS level-shifter circuit which exhibits a large voltage shift for high signal amplification.

Another object of the present invention is to provide a BiCMOS level-shifter circuit that has a reduced number of internal levels for minimizing delays and maximizing integration density.

Another object of the present invention is to provide a BiCMOS level-shifter circuit well adapted for use in ECL to CMOS input buffers.

Another object of the present invention is to provide an ECL to CMOS input-buffer that has reduced power dissipation and increased performance.

Another further object of the present invention is to provide an ECL to CMOS input-buffer which includes a reduced number of logic circuit blocks for increased integration density, mainly in the two phase version thereof.

According to the present invention, there is first disclosed a BiCMOS level-shifter circuit which comprises first and second NPN bipolar transistors mounted in an emitter-follower configuration with their respective emitter loads forming two branches connected between first and second supply voltages. Differential input signals are applied to their respective base electrodes. The emitter loads of said first and second bipolar transistors include a voltage source and a switch with a common node therebetween. This common node is formed by a first pole of the voltage source and a first contact of the switch. The second contact of the switch is tied to the second supply voltage. The common point of the switch constitutes one main output terminal of the level-shifter circuit and is therefore connected either to said common node or to said second supply voltage via the second contact of the switch, depending on the respective potential of said input signals. Because of the differential structure of said input signals, the switches operate in an opposite way.

According to a preferred embodiment of the level-shifter circuit, in each branch the voltage source consists of a PFET and the switch consists of a PFET and a NFET connected in series, the gate electrode of said NFET device being controlled by the potential of the said common node of the other branch. Moreover, in each branch, the gate electrode of the PFET forming the voltage source is connected to the common node of the FET devices forming the switch. The gate electrode of the PFET device forming the switches is connected to the second supply voltage.

Still according to the present invention, there is also disclosed an improved ECL to CMOS input buffer comprising:

a conventional ECL receiver comprised of an emitter-follower in series with a current-switch and supplying two differential output signals at the current-switch output nodes in response to an ECL input signal (VIN);

a level-shifter circuit as described above; and, two BiCMOS output drivers connected to the output nodes of the level-shifter circuit to supply the IN PHASE (VOUT) and OUT OF PHASE ($\overline{\text{VOUT}}$) circuit output signals at the CMOS level.

An improved new BiCMOS ECL to CMOS input buffer including an innovative level-shifter circuit is thereby disclosed. It offers shorter delays and reduced DC power dissipation over existing solutions.

BRIEF DESCRIPTION OF THE DRAWINGS

The novel features believed to be characteristic of this invention are set forth in the appended claims. The invention itself, however, as well as other objects and advantages thereof, may best be understood by reference to the following detailed description of illustrated preferred embodiments, read in conjunction with the accompanying drawings in which:

BEST MODE FOR CARRYING OUT THE INVENTION

Figure 3A:
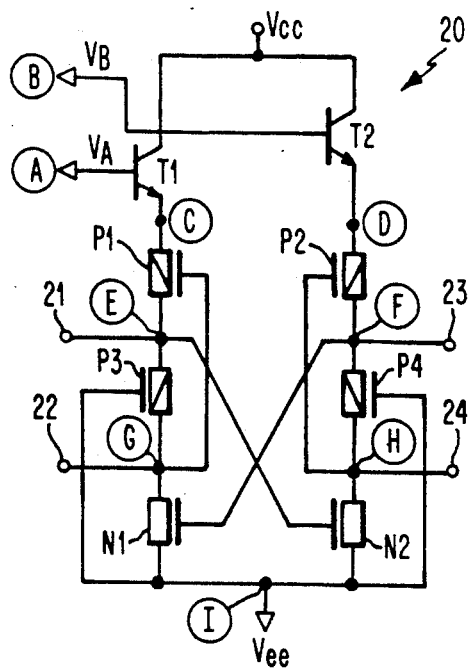
FIG. 3A illustrates the structure of the basic level-shifter circuit of the present invention.

The level-shifter circuit of the present invention is referenced 20 in FIG. 3A. Referring now to FIG. 3A, circuit 20 comprises two bipolar NPN transistors T1 and T2, each mounted in an emitter-follower configuration, thereby forming two branches connected between first and second supply voltages Vcc and Vee, respectively. In each branch, the emitter load consists of three FET devices in series having mutual cross-coupled connections between branches. In the first branch, two PFETs, P1 and P3, along with NFET N1 are connected in series with the emitter of transistor T1 and define nodes C, E and G. Similarly, in the second branch PFETs P2 and P4 along with NFET N2 form the emitter load of transistor T2, and define nodes D, F and H. Signals VA and VB drive the base electrodes of transistors T1 and T2. They are assumed to originate from a conventional ECL receiver, (e.g. receiver 11A formed by circuits 12 and 13 in FIG. 1). Variable drain currents flow through the branches depending upon the potential at nodes A and B of receiver 11A. To achieve the desired latching effect, the gate electrodes of NFETs N1 and N2 are respectively connected to nodes F and E. The output signals of the level-shifter circuit 20 are available at nodes E, G and F, H in the left and right branches, respectively. Output terminals 21, 22 and 23, 24 are respectively connected to these nodes. It is to be noted that PFETs P3 and P4 are connected in a common gate configuration and therefore are not controlled by their gate electrode, but by their source region. The role of PFETs P1 and P2 is to provide the desired voltage shifts at nodes E and F with respect to the potential at nodes A and B of receiver 11A, respectively. For instance, the voltage shift produced in the left or first branch is equal to the base to emitter voltage of T1 summed with the gate to source voltage of P1 [Vbe (T1) +Vgs (P1)], (about 2V). The pairs of FET devices N1−P3 and N2−P4, operate mainly as switches as will now be explained.

The circuit behavior will be illustrated for one transition of nodes A and B; the other one can be deduced thereof with a symmetrical analysis. If we suppose that the potential at node A goes up, node C follows and thus the potentials at nodes E and G go up because PFETs P1 and P3 are rendered conductive. NFET N2 is now conductive, thereby pulling down nodes H and F (because PFET P4 is on) and cutting off NFET N1. In the meantime, the potential at node B decreases, speeding up the potential drop at nodes D, F and H.

Figure 3B:
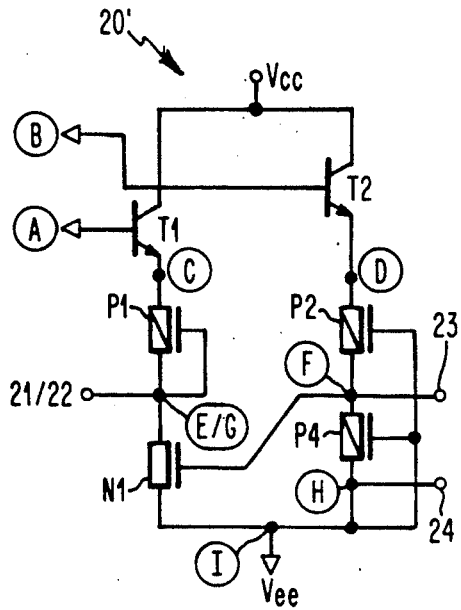
FIG. 3B illustrates the equivalent electrical circuit of the level-shifter circuit of FIG. 3A when node A is high and node B is low.

FIG. 3B shows the circuit of FIG. 3A in the quiescent state after this transition. In circuit 20′, devices P3 and N2 are not represented because of their negligible drain-source voltages. At the end of the transition, the current in the first branch is limited by the low Vgs of NFET N1 and the current in the second branch is also limited by the low Vgs and Vds of PFETs P2 and P4. Typical values of the DC current in the quiescent state are in the 20–50μA range.

Figure 3C:
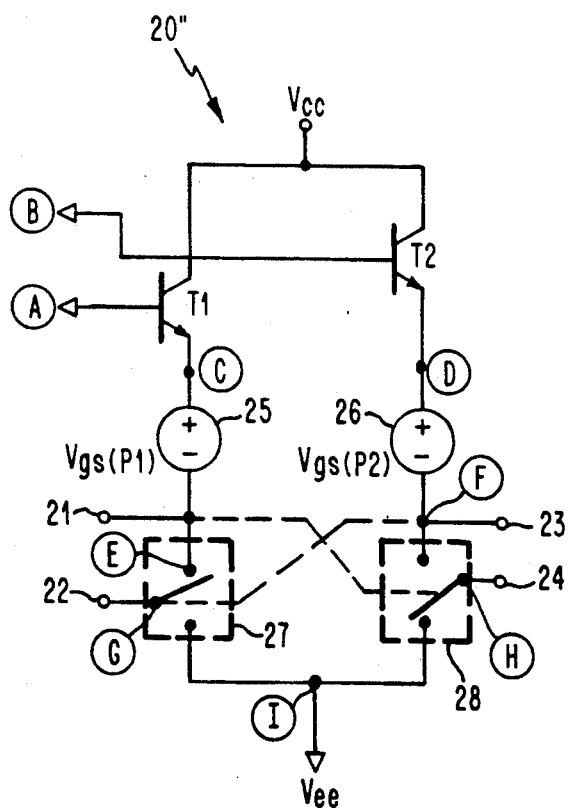
FIG. 3C illustrates the basic principle of the level-shifter circuit of FIG. 3A, when node A is high and node B is low.

FIG. 3C makes more clear the basic principle of the level-shifter circuit of the present invention. In circuit 20″, PFETs P1 and P2 are represented by voltage sources 25 and 26, equal to Vgs (P1) and Vgs (P2), respectively. FET devices N1, P3 and P4, N2 are represented by switches referenced 27 and 28, respectively. Node E formed between one pole of the voltage source 25 and a first contact of the switch 27 is referred to as the common node between the voltage source and the switch. Similar reasoning applies to node F. The other contact of switches 27 and 28 is connected to the second supply voltage Vee. The interconnection line is referred to as node I. Positions of the switches are mainly determined by the potentials at said common nodes, which are directly derived from the potentials at nodes A and B. When node A is high and node B is low, the potential at node F is low enough to cut off NFET N1, therefore switch 27 shorts node E (and terminal 21) to terminal 22 because PFET P3 is on. As a result, the potential at output terminals 21/22 is high, and equal to the potential of node A minus [Vbe(T1) +Vgs(P1)]. The potential at terminal 23 is low and switch 28 connects terminal 24 to the second supply voltage Vee. In FIG. 3C, switches 27 and 28 are positioned in accordance with the quiescent state illustrated in FIG. 3B.

General considerations may now be given for a better working of the circuit and its optimization. First of all, in accordance with its differential structure, symmetry must be applied to the devices. Therefore, corresponding devices in each branch must be identical. In others words, they must have the same size (symbolically described as P1 P2, P3 P4, and N1 n2). It is also desirable to have the Vgs of PFETs P1 and P2 equal, irrespective of the polarizing conditions (signals VA and VB). Thus, the output signals at nodes G and H will be respectively equal to the input signals produced at nodes A and B, minus a constant DC drop. The general reasoning which provides the above mentioned relationships is provided hereinafter.

When ode A is high and node B low, the level-shifter circuit 230 of FIG. 3A is reduced to the schematic circuit 20' of FIG. 3b. Assuming that all devices are saturated and the threshold voltages (VTs) of the PFETs and NFETs are similar, the particular conditions to be fulfilled by the FET devices to ensure that Vgs(P1)=Vgs(P2) can be determined from the circuit of FIG. 3B using the following computation:

In the first branch, the current flowing in devices P1 and N1 is respectively:

$$Ids(P1) = K(P1) \cdot [Vgs(P1) - VT(P1)]^2 \quad (1)$$

$$Ids(N1) = K(N1) \cdot [Vgs(N1) - VT(N1)]^2 \quad (2)$$

In the second branch the current flowing in devices P2 and P4 is respectively:

$$Ids(P2) = K(P2) \cdot [Vgs(P2) - VT(P2)]^2 \quad (3)$$

$$Ids(P4) = K(P4) \cdot [Vgs(P4) - VT(P4)]^2 \quad (4)$$

where $K = [\mu \cdot Cox \cdot W]/2L$ $\mu$ is the carrier mobility, Cox the gate oxide capacitance, W the device width and L the FET device length, for a determined FET device.

$$e.g. \; K(P1) = [\mu_p \cdot Cox \cdot W(P1)]/2L(P1)$$

$$K(N1) = [\mu_n \cdot Cox \cdot W(N1)]/2L(N1)$$

Since Ids(P1)=Ids(N1) and Ids(P2)=Ids(P4)
combining equations (1) to (4) results in the following relationship:

$$\frac{[K(N1) \cdot K(P2)]}{[K(P1) \cdot K(P4)]} = 1 \quad (5)$$

An equivalent relation can be set up between devices P1, P2, P3 and N2, when node A is low and node B high.

$$\frac{[K(N2) \cdot K(P1)]}{[K(P2) \cdot K(P3)]} = 1 \quad (6)$$

As it has been said above, circuit 20 is a symmetrical circuit, therefore corresponding devices in the two branches are designed to be identical. Then, relations (5) and (6) simplify to:

$$K(N1) = K(P4) \quad (7)$$

$$K(N2) = K(P3) \quad (8)$$

Assuming Cox and L are the same for PFETs and NFETs, and that the carrier mobility ratio between electron and holes $\mu_N/\mu_P$ is approximately equal to 2.5, this finally results in a coarse size ratio between the P and N devices.

For example, K(N1) =K(P4) can be rewritten $$\mu_N \cdot W(N1) = \mu_P \cdot W(P4), \text{else}$$

$$\frac{W(N1)}{W(P4)} = \frac{\mu_P}{\mu_N} = \frac{1}{2.5} \text{ and similarly } \frac{W(N2)}{W(P3)} = \frac{1}{2.5}$$

In summary, for an improved operation of the level-shifter circuit of FIG. 3A, it is therefore recommended to adopt the above mentioned size ratios between the subject FET devices.

Figure 4B:
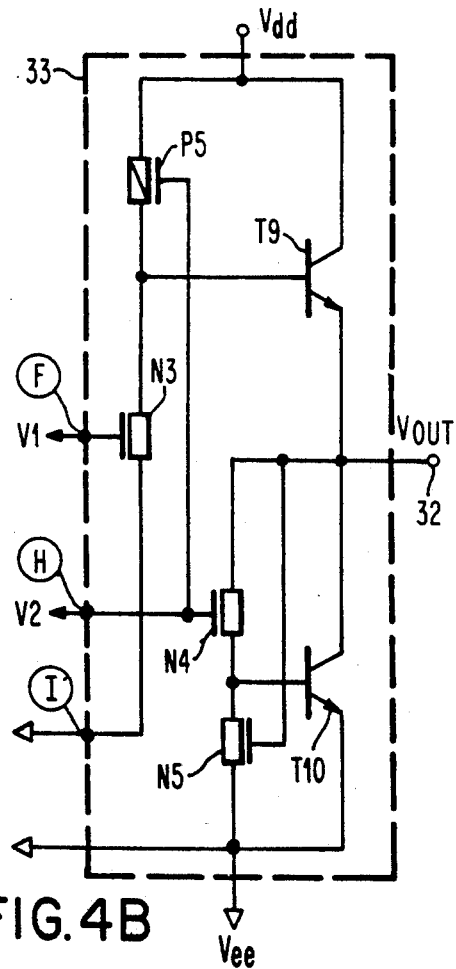
FIG. 4B illustrates an output driver of a second type when adapted to reduced output voltage swings.
Figure 4A:
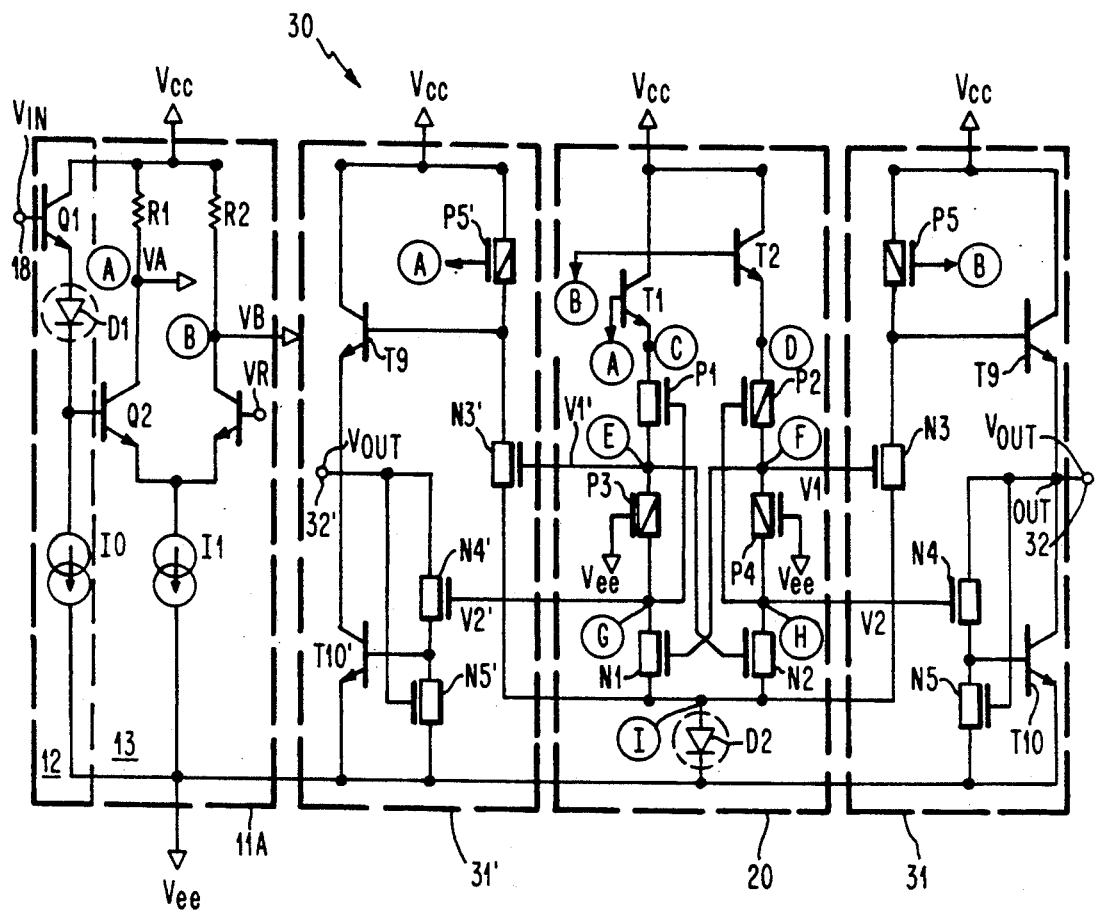
FIG. 4A illustrates a two-phase ECL to CMOS input buffer including a conventional receiver, the level-shifter circuit of the present invention and two output drivers of a first type to deliver large output voltage swings.

An ECL to CMOS input buffer including the new level-shifter circuit of the present invention is illustrated in FIG. 4A.

Figure 1:
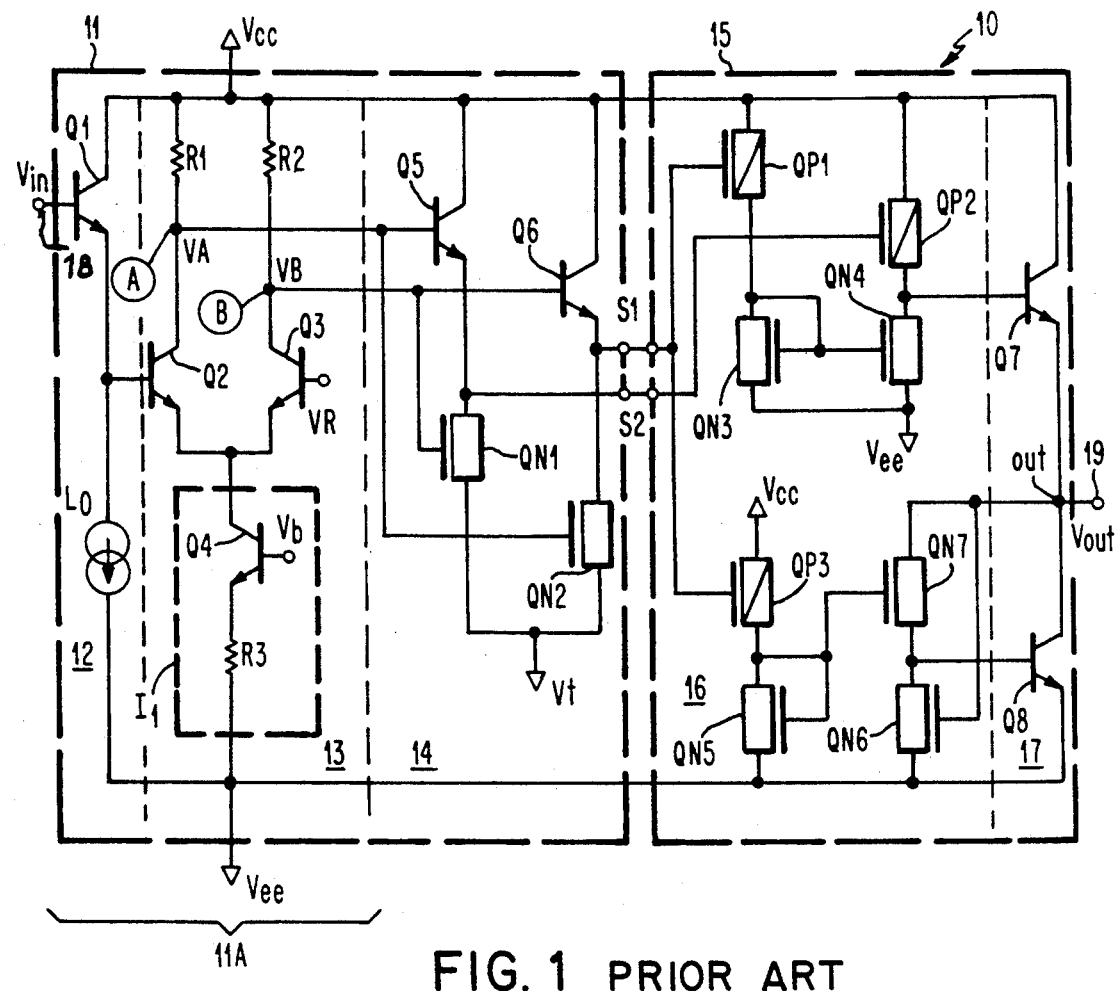
FIG. 1 illustrates an advanced single phase ECL to CMOS input buffer of the prior art.
Figure 2:
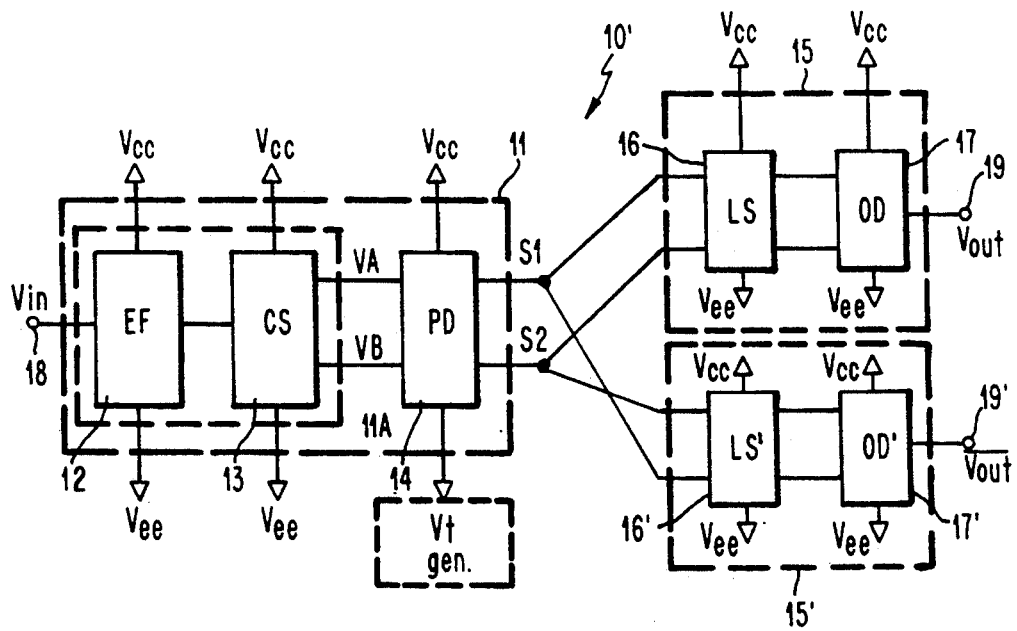
FIG. 2 illustrates the schematic functional block diagram of the implementation of the input buffer of FIG. 1 in a two phase version.

Referring now to FIG. 4A, input buffer 30 comprises an ECL receiver 11A of FIG. 1, the level-shifter circuit 20 of FIG. 3A, and two BiCMOS output drivers 31 and 31' for delivering the true (IN PHASE) and complement (OUT OF PHASE) circuit output signals VOUT and $\overline{VOUT}$ at the respective output terminals 32 and 32'.

ECL receiver 11A and level-shifter circuit 20 can be used without any modification. However, these circuits may be provided with extra diodes to adjust the voltage levels. As shown in FIG. 4A, diode D1 increases the voltage swing on resistors R1 and R2, thereby preventing saturation of bipolar transistors Q2 and Q3. Another extra diode D2 is connected to the common node of NFETs N1 and N2 in the level-shifter circuit and centers the signals that are applied to the output drivers 31 and 31'.

Output drivers 31 and 31' are relatively conventional BiCMOS circuits except that the gate electrodes of the input devices are not tied to the same node, but to two nodes of the level-shifter circuit, in order to further improve input buffer performance. For example, output driver 31 comprises two bipolar transistors T9 and T10. Top transistor T9 is driven by NFET N3 whose gate is connected to node F (signal V1) and by PFET P5 whose gate electrode is connected to node B (signal VB). On the other hand, bottom transistor T10 is driven by NFET N4 whose gate electrode is connected to node H (signal V2) and by NFET N5 whose gate electrode is connected to circuit common output node OUT and then to circuit output terminal 32. Output driver 31' has an identical hardware construction, but PFET P5' is driven by the potential of node A (signal VA). The gate electrodes of NFETs N3' and N4' are connected to nodes E (signal V1') and G (signal V2'). The input buffer of FIG. 4A is well suited for technologies where FET devices can withstand ECL voltage supplies, and therefore, be able to deliver large swing signals at terminals 32 and 32'.

Input buffer 30 is a two phase version. The level-shifter circuit 20 produces a large voltage shift of about 2V from node A to E in the first branch, and from B to F in the second branch. As a result, less amplification is required in the output drivers 31 and 31'. For instance, in output driver 31, signals V1 and V2 respectively produced at nodes F and H can drive NFETs N3 and N4 directly. This construction therefore results in a reduced number of devices and minimal propagation delays for output transistors, as apparent from FIG. 4A.

FIG. 4B shows a variant of the output driver 31 of FIG. 4A referenced 33. The main differences between the two circuits are found in the power supplies and in the connection of the gate electrodes of PFET P5. In the circuit of FIG. 4B, the gate electrode of PFET P5 is no longer connected to node B, but is connected to node H. An input buffer 30' (not shown) built with two output drivers 33 and 33', like input buffer 30 is built with two output drivers 31 and 31', would be suited for applications where CMOS devices cannot withstand ECL power supply levels. It can deliver smaller swing signals when compared to input buffer 30. As apparent from FIG. 4B, output driver 33 needs the use of power supply Vdd, which is the same power supply as the one already used in the chip for the internal CMOS circuit blocks. Because, CMOS circuit blocks always use the Vdd power supply, the latter cannot be considered as an additional supply voltage.

Figure 5:
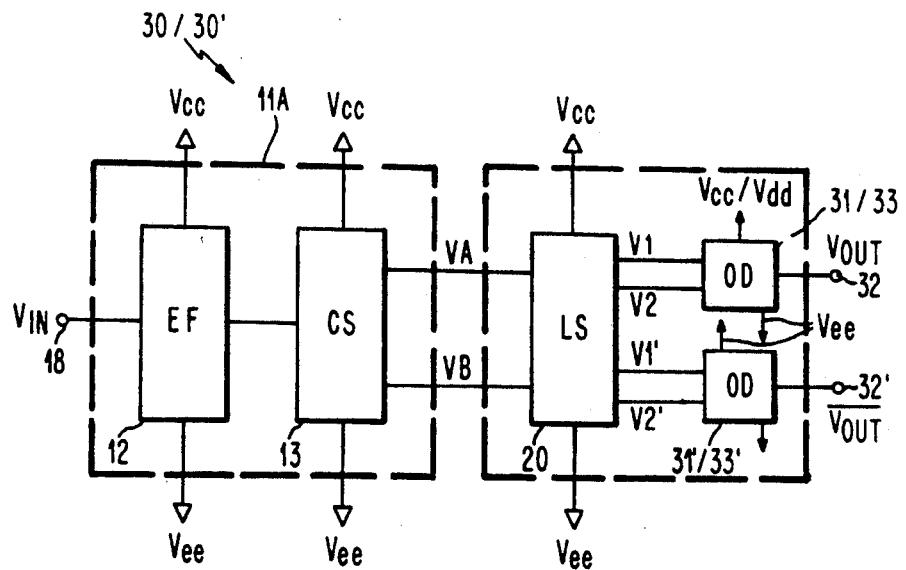
FIG. 5 illustrates the schematic functional block diagram of the input buffers of the present invention including both types of output drivers.

FIG. 5 illustrates the schematic functional block diagram of input buffers 30/30'. In both cases, the component count (still excluding the ECL receiver 11A) is 6 bipolar transistors and 14 FET devices, because of the elimination of the need for the Vt generator which is a reduction of approximately 10 FET devices.

Figure 6A:
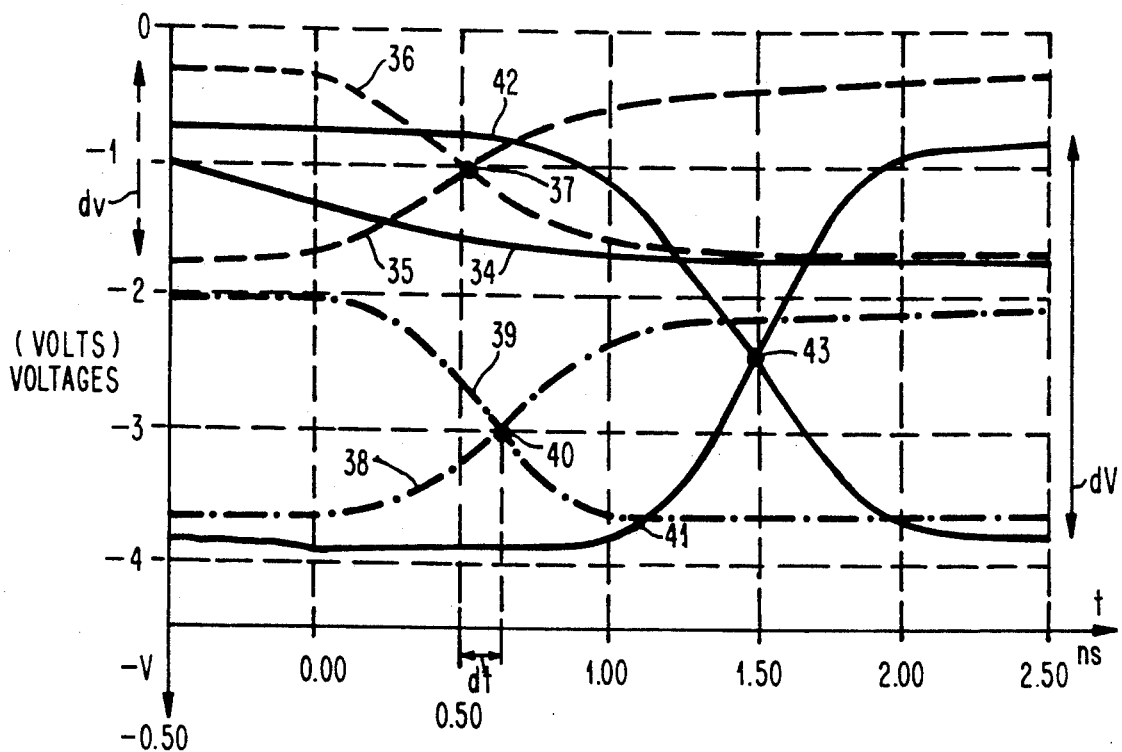
FIGS. 6A and 6B illustrate the waveforms at various nodes/terminals of the input buffers of the present invention.

FIG. 6A shows the waveforms (voltage in Volts vs Time in ns) at different nodes/terminals of the input buffer 30 of FIG. 4A. Curve 34 represents the input signal VIN in a down-going transition from −0.9V to −1.7V. Curves 35 and 36 illustrate the waveforms at nodes A and B respectively and cross at point 37. Curves 38 and 39 illustrate the waveforms at nodes G and H respectively and cross at point 40. The delay dt between the two crossing points 37 and 40 demonstrates the effectiveness of the level-shifter circuit 20. As apparent from FIG. 6A, this delay is about 150 ps. The output signals VOUT and $\overline{VOUT}$ are illustrated by curves 41 and 42 respectively which cross at point 43. The voltage swing dV of the output signals is greater by about a factor of 2 than the swing dv of the input signals. It is also clear that the differential voltage between nodes A and B, and nodes G and H are almost identical due to the optimization explicited above. In addition, the difference between points 37 and 40 demonstrates a final voltage shift of about 2V is obtained. Finally, it is also apparent from FIG. 6A that curves 41 and 42 (which represent circuit output signals VOUT and $\overline{VOUT}$), are quite symmetrical around the average value illustrated by point 43, (around −2.3 V).

Figure 6B:
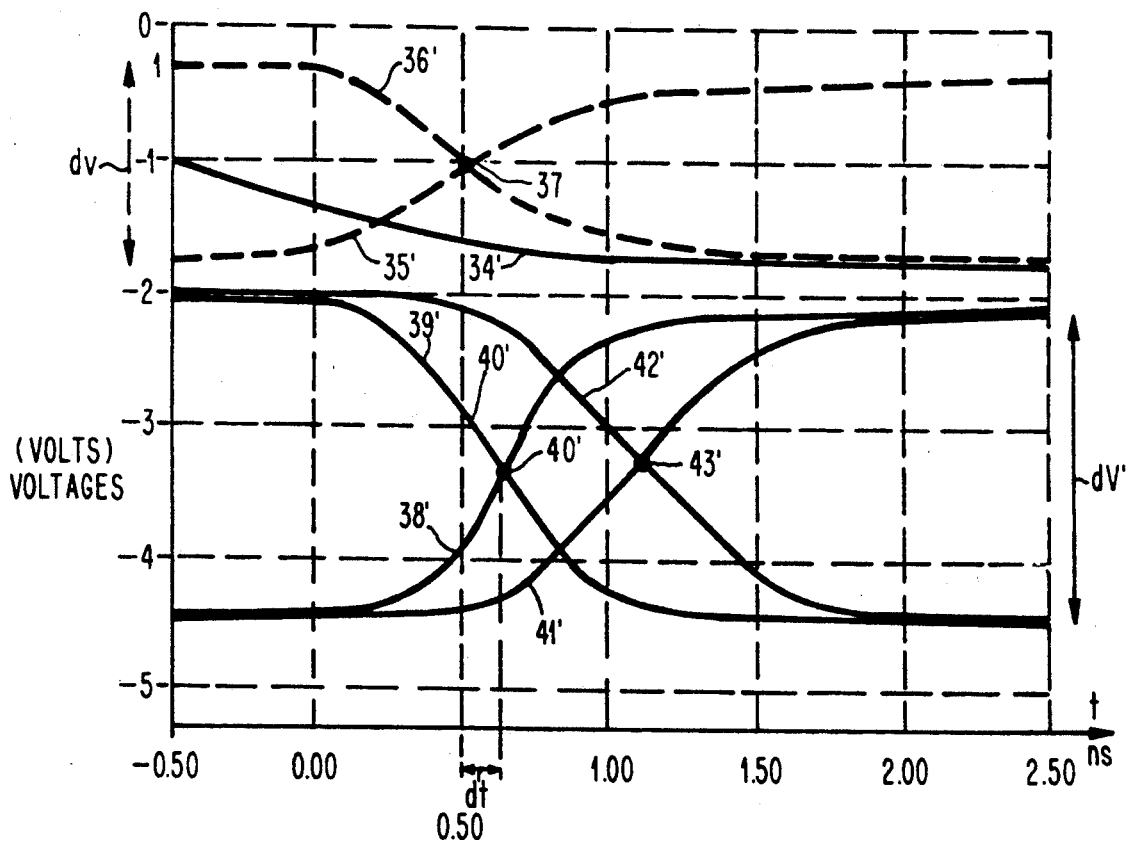

Waveforms for input buffer 30' are illustrated in FIG. 6B. In FIG. 6B the corresponding curves are referenced with a prime reference. It is to be noted that circuit output voltage swing dV' is lower in FIG. 6B than the output voltage swing dV depicted in FIG. 6A.

Input buffer 30 of FIG. 4A can be compared with the conventional solution of FIG. 1. Delays and average currents are summed up in the table below for the same input swing (−0.9V/−1.7V) and working frequency (50 MHz):

TABLE

| CIRCUIT | DELAY | TOTAL CURRENT (AC + DC) | OUTPUT LEVELS | SUPPLY (Vee) |
|---|---|---|---|---|
| Input buffer of FIG. 1 | 1.8 ns | 2.2 mA | −0.4 V/−4.1 V | −4.5 V |
| Input buffer of FIG. 4A | 1.4 ns | 0.8 mA | −0.4 V/−4.1 V | −4.5 V |

This table shows that the input buffer 30 of the present invention is faster, while the consumed current is divided by more than 2 with regard to the state of the art solution illustrated in FIG. 1. The low power consumption resulting therefrom is mainly due to the very low DC current (20−50 μA) flowing through the level-shifter circuit in the quiescent state. The improvement in performance is due to the constantly positive overdrive voltage of the PFETs of the level-shifter circuit. In addition, it should be noted that, throughout its structure, this new level-shifter does not require any reference voltage and simultaneously gives true and complementary output signals with a minimum of circuit duplication.

Although the invention has been shown and described with exemplary embodiments thereof, it should be understood by those skilled in the art that the foregoing and various other changes, omissions and additions may be made therein and thereto without departing from the spirit and scope of the invention.

We claim:

1. A level-shifter circuit comprising:
   first and second supply voltages (Vcc, Vee);
   first and second differential input signals (VA, VB);
   a first bipolar transistor (T1) responsive to said first differential input signal (VA) having a base electrode connected to said first differential input signal (VA) and a collector electrode connected to said first supply voltage (Vcc);
   a first branch connected between the emitter electrode of said first bipolar transistor (T1) and said second supply voltage (Vee), comprised of a series connection of a first FET device (P1) of a first conductivity type, a second FET device (P3) of said first conductivity type, and a third FET device (N1) of a second conductivity type opposite to said first conductivity type;
   a second bipolar transistor (T2) responsive to said second differential input signal having a base electrode connected to said second differential input signal (VB) and a collector electrode connected to said first supply voltage (Vcc);
   a second branch connected between the emitter electrode of said second bipolar transistor (T2) and said second supply voltage (Vee) comprised of a series connection of a fourth FET device (P2) of said first conductivity type, a fifth FET device (P4) of said first conductivity type, and a sixth FET device (N2) of said second conductivity type;
   wherein the gate electrodes of said second and fifth FET devices are connected to first and second reference voltages, respectively, and,
   wherein said first and second FET devices have a first common node (E) for providing a first output signal (V1') connected to the gate electrode of said sixth FET device, said second and third FET devices have a second common node (G) for providing a second output signal (V2') connected to the gate electrode of said first FET device, said fourth and fifth FET devices have a third common node (F) for providing a third output signal (V3') connected to the gate electrode of said third FET device, said fifth and sixth FET devices have a fourth common node (H) for providing a fourth output signal (V4') connected to the gate electrode of said fourth FET device.

2. A level-shifter circuit according to claim 1, wherein said first and second bipolar transistors are of the NPN type and said first, second, fourth and fifth FET devices are PFETs (respectively P1, P3, P4 and P5) and said third and sixth FET devices are NFETs (respectively N1 and N2).

3. A level-shifter circuit according to claim 2, wherein said first and second reference voltages are said second supply voltage (Vee).

4. A level-shifter circuit according to claim 2 or 3, wherein said first and fourth (P1 and P2), second and fifth (P3 and P4), and third and sixth (N1 and N2), corresponding FET devices have substantially identical sizes.

5. A level-shifter circuit according to claim 2 or 3, wherein said FET devices have the following relationship:

$$\frac{[K(N1) \cdot K(P2)]}{[K(P1) \cdot K(P4)]} = 1 \text{ and } \frac{[K(N2) \cdot K(P1)]}{[K(P2) \cdot K(P3)]} = 1$$

with $K = /2L$ wherein $\mu$ is the carrier mobility, Cox is the gate oxide capacitance, W is the device width and L is the FET device length, for a determined FET device.

6. A level-shifter circuit according to claim 4, wherein the device width ratios W(N1)/W(P4) and W(N2)/W(P3) are on the order of 0.40.

7. An input buffer circuit comprising:
first and second supply voltages (Vcc, Vee);
an input signal VIN having a voltage swing on the order of $-0.9$ to $-1.7$ volts;
an ECL receiver circuit means (11A) having:
  a) emitter follower circuit means (12) responsive to said input signal VIN for providing a driving signal as a function of said input signal; and,
  b) current switch circuit (13) means responsive to said driving signal for providing first and second differential signals (VA, VB) as a function of said driving signal;
a level shifter circuit having:
  a) a first bipolar transistor (T1) responsive to said first differential signal having a base electrode connected to said first differential signal (VA) and a collector electrode connected to said first supply voltage (Vcc);
  b) a first branch connected between the emitter electrode of said first bipolar transistor (T1) and said second supply voltage (Vee) comprised of a series connection of a first FET device (P1) of a first conductivity type, a second FET device (P3) of said first conductivity type, and a third FET device (N1) of a second conductivity type opposite to said first conductivity type;
  c) a second bipolar transistor (T2) responsive to said second differential signal having a base electrode connected to said second differential signal (VB) and a collector electrode connected to said first supply voltage (Vcc);
  d) a second branch connected between the emitter electrode of said second bipolar transistor (T2) and said second supply voltage (Vee) comprised of a series connection of a fourth FET device (P2) of said first conductivity type, a fifth FET device (P4) of said first conductivity type, and a sixth FET device (N2) of said second conductivity type,
  wherein the gate electrodes of said second and fifth FET devices are connected to first and second reference voltages, respectively, and wherein said first and second FET devices have a first common node (E) for providing a first output signal (V1') connected to the gate electrode of said sixth FET device, said second and third FET devices have a second common node (G) for providing a second output signal (V2') connected to the gate electrode of said first FET device, said fourth and fifth FET devices have a third common node (F) for providing a third output signal (V3') connected to the gate electrode of said third FET device, said fifth and sixth FET devices have a fourth common node (H) for providing a fourth output signal (V4') connected to the gate electrode of said fourth FET device; and,
first output driver circuit means (31) responsive to at least one of said output signals (V1', V2', V3', V4') for providing a buffered signal as a function of said output signals.

8. An input buffer circuit according to claim 7, wherein said first and second bipolar transistors are of the NPN type and said first, second, fourth and fifth FET devices are PFETs (respectively P1, P3, P4 and P5) and said third and sixth FET devices are NFETs (respectively N1 and N2).

9. An input buffer circuit according to claim 8, wherein said first and second reference voltages are said second supply voltage (Vee).

10. An input buffer circuit according to claim 7, 8 or 9, wherein the first and fourth (P1 and P2), second and fifth (P3 and P4), and third and sixth (N1 and N2), corresponding FET devices have substantially identical sizes.

11. An input buffer circuit according to claim 8 or 9, wherein said FET devices have the following relationship:

$$\frac{[K(N1) \cdot K(P2)]}{[K(P1) \cdot K(P4)]} = 1 \text{ and } \frac{[K(N2) \cdot K(P1)]}{[K(P2) \cdot K(P3)]} = 1$$

with $K = /2L$ wherein $\mu$ is the carrier mobility, Cox is the gate oxide capacitance, W is the device width and L is the FET device length, for a determined FET device.

12. An input buffer circuit according to claim 11, wherein the device width ratios W(N1)/W(P4) and W(N2)/W(P3) are on the order of 0.40.

13. An input buffer circuit according to claim 8 or 9, wherein said first output driver circuit means (31) comprises:
a first output PFET transistor (P5) connected in series with a first output NFET transistor (N3) between said first and second supply voltages (Vcc, Vee), having a first common circuit output node at the junction therebetween for providing a fifth output signal; wherein the gate electrode of said first output NFET transistor (N3) is responsive to said third common node (F), and the gate electrode of said first output PFET transistor (P5) is responsive to said second differential signal (VB);
a second output NFET transistor (N4) connected in series with a third output NFET transistor (N5) between a second common output node (OUT) and said second supply voltage (Vee), having a third common circuit output node at the junction therebetween for providing a sixth output signal, wherein the gate electrode of said second output NFET transistor (N4) is responsive to said fourth common node (H), and the gate electrode of said third output NFET transistor is responsive to said sixth output signal; and,
first and second output NPN transistors (T9, T10) connected in series between said first and second supply voltages (Vcc, Vee), having said second common circuit output node (OUT) at the junction therebetween for providing a buffered signal, wherein the base electrode of said first output NPN transistor (T9) is responsive to said fifth output signal and the base electrode of said second output NPN transistor (T10) is responsive to said sixth output signal.

14. An input buffer circuit according to claim 8 or 9, further comprising a signal centering diode (D2) connected between said first branch and said second supply voltage (Vee).

15. An input buffer circuit according to claim 14, further comprising an antisaturation diode (D1) connected between said driving signal and said current switch circuit means (13).

* * * * *

UNITED STATES PATENT AND TRADEMARK OFFICE
CERTIFICATE OF CORRECTION

PATENT NO. : 5,173,624
DATED : December 22, 1992
INVENTOR(S) : Bertrand Gabillard, Philippe Girard, Michel Granguillot It is certified that error appears in the above-indentified patent and that said Letters Patent is hereby corrected as shown below:

In column 11, line 5, change "K = /2L" to --K = [µ . Cox . W[ /2L --.
In column 12, line 21: change "K = /2L" to -- K = [µ . Cox . W]/2L --.

Signed and Sealed this

Sixteenth Day of August, 1994

Attest:

BRUCE LEHMAN

*Attesting Officer*          *Commissioner of Patents and Trademarks*